United States Patent
Feng et al.

(10) Patent No.: US 10,263,095 B2
(45) Date of Patent: Apr. 16, 2019

(54) METHOD OF FORMING SEMICONDUCTOR FIN STRUCTURE

(71) Applicant: UNITED MICROELECTRONICS CORP., Hsin-Chu (TW)

(72) Inventors: Li-Wei Feng, Kaohsiung (TW);
Shih-Hung Tsai, Tainan (TW);
Chih-Kai Hsu, Tainan (TW);
Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/995,083

(22) Filed: May 31, 2018

(65) Prior Publication Data
US 2018/0286966 A1    Oct. 4, 2018

Related U.S. Application Data

(63) Continuation of application No. 15/196,024, filed on Jun. 28, 2016, now Pat. No. 10,056,467.

(30) Foreign Application Priority Data

Mar. 22, 2016 (TW) .............................. 105108732 A

(51) Int. Cl.
| | | |
|---|---|---|
| *H01L 21/84* | (2006.01) | |
| *H01L 27/12* | (2006.01) | |
| *H01L 29/66* | (2006.01) | |
| *H01L 29/78* | (2006.01) | |
| *H01L 21/308* | (2006.01) | |
| *H01L 27/088* | (2006.01) | |
| *H01L 21/8234* | (2006.01) | |

(52) U.S. Cl.
CPC .... *H01L 29/66545* (2013.01); *H01L 21/3085* (2013.01); *H01L 21/823431* (2013.01); *H01L 21/845* (2013.01); *H01L 27/0886* (2013.01); *H01L 27/1211* (2013.01); *H01L 29/6681* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,802,521 B1 | 8/2014 | Hung | |
| 8,951,870 B2 | 2/2015 | Basker | |
| 9,356,046 B2 * | 5/2016 | Cheng | ................. H01L 27/1211 |
| 2013/0277720 A1 | 10/2013 | Kim | |

(Continued)

*Primary Examiner* — Shaun M Campbell
(74) *Attorney, Agent, or Firm* — Winston Hsu

(57) ABSTRACT

A method of forming a semiconductor fin structure is provided. A substrate is provided, which has at least two sub regions and a dummy region disposed between the two sub regions. A recess is disposed in each sub region. A semiconductor layer is formed to fill the recesses. A patterned mask layer is formed on the semiconductor layer in the sub regions and on the substrate in the dummy region. The substrate and the semiconductor layer are removed by using the patterned mask layer as a mask, thereby forming a plurality of fin structures in the sub regions and a plurality of dummy fin structures in the dummy region.

12 Claims, 7 Drawing Sheets

(56) References Cited

U.S. PATENT DOCUMENTS

| | | | |
|---|---|---|---|
| 2014/0097518 A1* | 4/2014 | Cheng | H01L 27/0886 |
| | | | 257/618 |
| 2015/0060959 A1* | 3/2015 | Lin | H01L 29/785 |
| | | | 257/288 |
| 2015/0108616 A1* | 4/2015 | Greene | H01L 21/02636 |
| | | | 257/623 |
| 2015/0145065 A1 | 5/2015 | Kanakasabapathy | |
| 2015/0214117 A1* | 7/2015 | Cheng | H01L 29/785 |
| | | | 438/504 |
| 2015/0357439 A1 | 12/2015 | Liu | |
| 2016/0005738 A1* | 1/2016 | Liu | H01L 27/0924 |
| | | | 257/369 |
| 2016/0181395 A1* | 6/2016 | Liu | H01L 29/66545 |
| | | | 257/347 |
| 2017/0133264 A1 | 5/2017 | Kim | |
| 2017/0194149 A1 | 7/2017 | Chang | |

\* cited by examiner

METHOD OF FORMING SEMICONDUCTOR FIN STRUCTURE

CROSS REFERENCE TO RELATED APPLICATIONS

This application is a continuation application of application Ser. No. 15/196,024 filed on Jun. 28, 2016, and included herein by reference.

BACKGROUND OF THE INVENTION

1. Field of the Invention

The present invention is related to a semiconductor structure with fin structures, and more particularly, to a semiconductor structure with fin structure having at least two semiconductor materials.

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demands of products.

However, with the increasing miniaturization of electronic products, current planar FETs no longer meet the requirements of the products. Thus, non-planar FETs such as Fin-shaped FETs (Fin-FET) have been developed, which includes a three-dimensional channel structure. The manufacturing processes of Fin-FET devices can be integrated into traditional logic device processes, and thus are more compatible. In addition, since the three-dimensional structure of the Fin-FET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased. In current years, the development of the Fin-FETS is still aiming to devices with smaller scales.

SUMMARY OF THE INVENTION

The present invention therefore provides a method of forming fin structures, which can provide better performance.

According to one embodiment of the present invention, a method of forming a semiconductor fin structure is provided. A substrate is provided, which has at least two sub regions and a dummy region disposed between the two sub regions. A recess is disposed in each sub region. A semiconductor layer is formed to fill the recesses. A patterned mask layer is formed on the semiconductor layer in the sub regions and on the substrate in the dummy region. The substrate and the semiconductor layer are removed by using the patterned mask layer as a mask, thereby forming a plurality of fin structures in the sub regions and a plurality of dummy fin structures in the dummy region.

According to another embodiment, the present invention further provides a semiconductor fin structure, which includes a substrate, a plurality of first fin structures, a doped well. The substrate has a first region with at least two sub regions and a dummy region, wherein the dummy region is disposed between the two sub regions. The first fin structures are disposed in the sub regions. The doped well is disposed in the first region, wherein a top surface of the doped well in the dummy region is not leveled with a top surface of the doped well in the sub regions.

The method of forming fin structures is characterized by defining plural small sub regions in one first region, thus, the semiconductor layer will be formed respectively in the sub regions and the dishing problem in conventional arts can be avoided.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
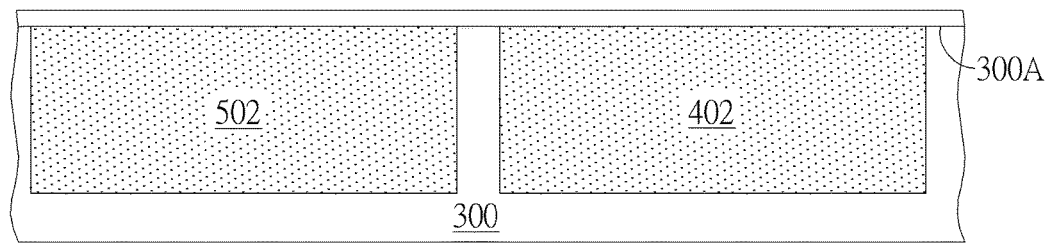
FIG. 1 to FIG. 9 shows schematic diagrams of the method of forming a semiconductor fin structure according to one embodiment of the present invention.

Please refer to FIG. 1 to FIG. 9, which shows schematic diagrams of the method of forming a semiconductor fin structure according to one embodiment of the present invention. As shown in FIG. 1, a substrate 300 is provided with a top surface 300A to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, is also suitable for the semiconductor substrate 300. The substrate 300 has a first region 400 and a second region 500. In one embodiment, the first region 400 is a P-type transistor region, having an N type doped well 402 disposed therein; the second region 500 is an N-type transistor region, having a P type doped well 502 disposed therein. The method of forming the N type doped well 402 and the P type doped well 502 includes, for example, forming a pad layer 302 on the top surface 300A of the substrate 300. The pad layer 302 preferably includes silicon oxide which can be formed by a thermal oxidation process to exhibit a predetermined thickness. A first patterned mask layer (not shown) is formed on the pad layer 302. An ion implantation process is performed by using the first patterned mask layer as a mask to form the N type doped well 402, and then the first patterned mask layer is removed away. Subsequently, a second patterned mask layer (not shown) is formed on the pad layer 302. An ion implantation process is performed by using the second patterned mask layer as a mask to form the P type doped well 502, and then the second patterned mask layer is removed away. It is noted that depending the design of the process, the orders of forming the N type doped well 402 and forming the P type doped well 502 can be reversed. Besides, the first region 400 includes a plurality of sub regions 400A and at least one dummy region 400B, wherein the dummy region 400B is disposed between two sub regions 400A. In another embodiment, the pad layer 302 can be omitted.

Figure 2:
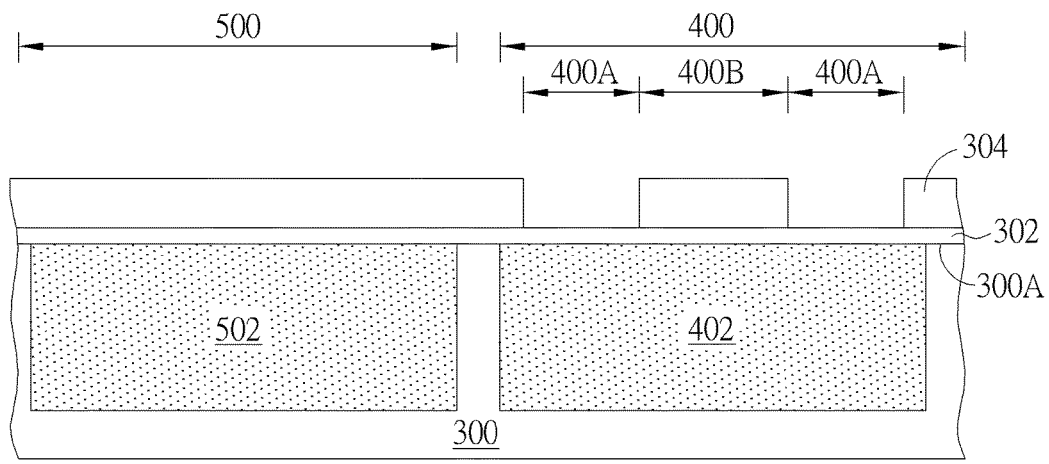

As shown in FIG. 2, a patterned mask layer 304 is formed on the pad layer 302. In the first region 400, the patterned mask layer 304 exposes the pad layer 302 in the sub regions 400A, and does not expose the pad layer 302 outside the sub regions 400A, such as the pad layer 302 in the dummy region 400B. In the second region 500, the pad layer 302 is covered by the patterned mask layer 304. The patterned mask layer 304 can be any materials suitable as a mask, for example, silicon nitride (SiN), silicon oxynitride (SiON), silicon carbide (SiC) or advanced pattern film (APF) provided by the Applied Materials Co. In one embodiment, the patterned mask layer 304 is photo resist.

Figure 3:
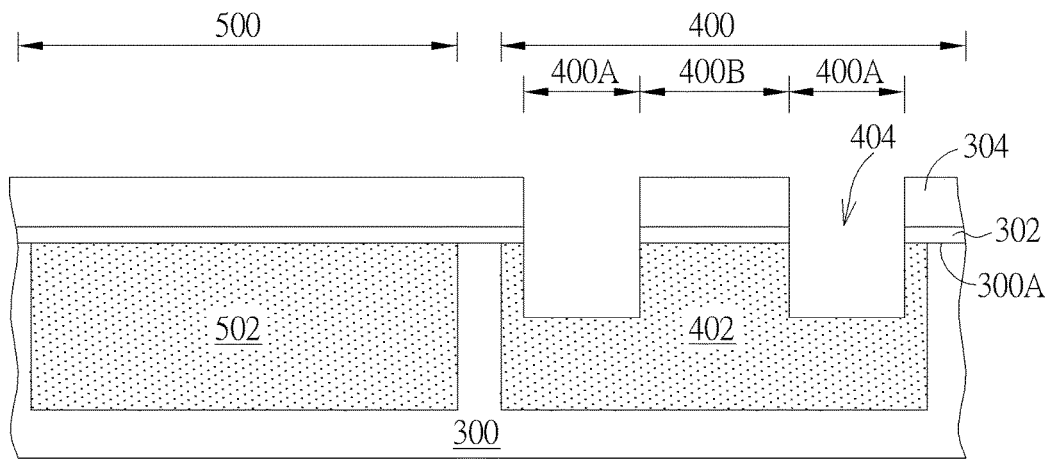

As shown in FIG. 3, the exposed substrate 300 and the exposed pad layer 302 are patterned by using the patterned mask layer 304 as a mask, thereby forming a plurality of trenches 404. As shown in FIG. 3, the depth of the trench 404 is not greater than the depth of the N type doped well 402. In one embodiment, a ratio of the depth of the trench 404 and the depth of the N type doped well 402 is between 1:2 and 1:3. Then, the patterned mask layer 304 is removed away.

Figure 4:
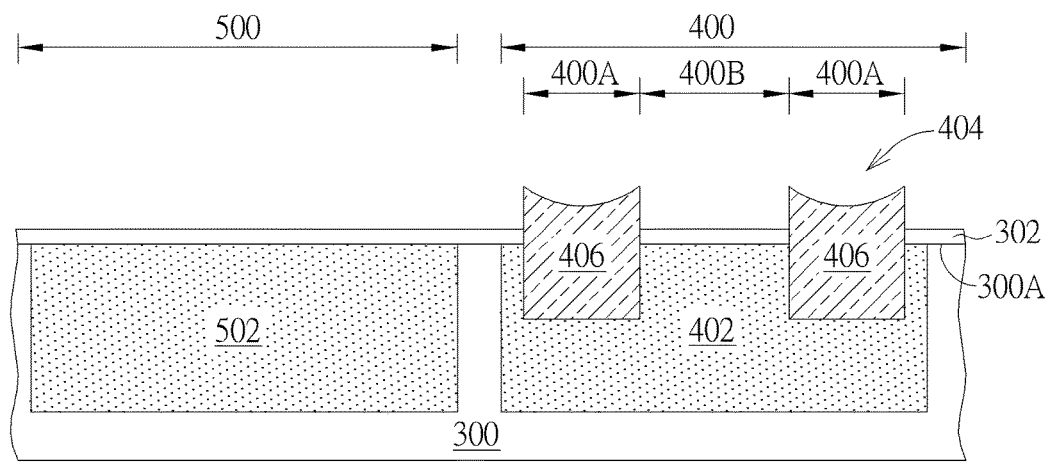

As shown in FIG. 4, a semiconductor layer 406 is formed in the trenches 404 wherein the trenches 406 are completely filled with the semiconductor layer 406. In one embodiment, the semiconductor layer 406 is formed by a selective epitaxial growth (SEG) process, and the material thereof may be any silicon and/or germanium compound, with optionally doped with group III and/or group V element. In one embodiment, the semiconductor layer 406 is silicide-germanium (SiGe). Since the semiconductor layer 406 is formed simultaneously in one single SEG process and is formed individually in the plural trenches 404, the semiconductor layer 406 is not suffering from the dishing problem and only slightly concave is observed on top surface of the semiconductor layer 406. A better uniformity of the semiconductor layer 406 therefore is formed.

Figure 5:
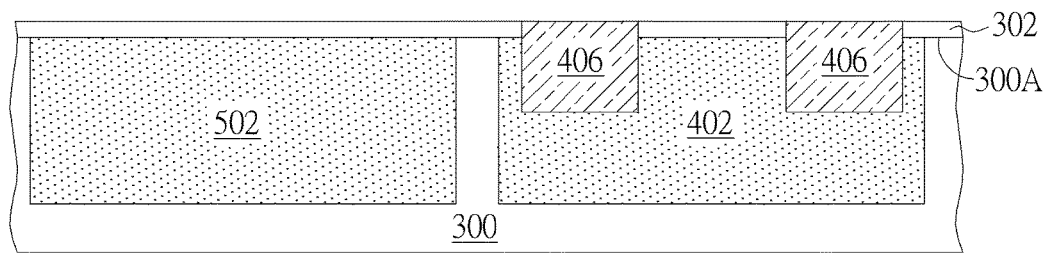

As shown in FIG. 5, a planarization process is performed to make the semiconductor layer 406 level with the pad layer 302. In one embodiment of the invention, the planarization process, such as a chemical mechanical polishing (CMP) process, uses the pad layer 302 as a polishing stop layer, so that the top surface of the semiconductor layer 406 is higher than the top surface 300A of the substrate 300.

Figure 6:
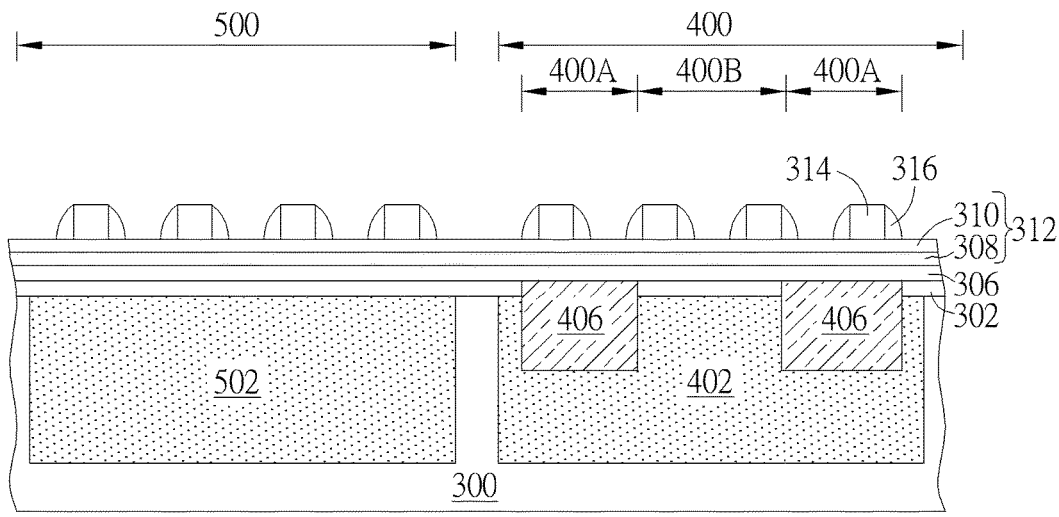

As shown in FIG. 6, a stacking structure 312 is formed on the substrate 300, for example, an oxide layer 306, a nitride layer 308 and an oxide layer 310. A plurality of mandrels 314 are formed on the stacking structure 312 and a spacer 316 is formed on the sidewall of each mandrel 314. In one embodiment, the mandrel 314 includes poly-silicon or amorphous silicon and the spacer 316 includes silicon oxide, silicon nitride, high temperature oxide (HTO) or silicon nitride with precursors including hexachlorodisilane ($Si_2Cl_6$) (HCD-SiN), and is not limited thereto.

Figure 7:
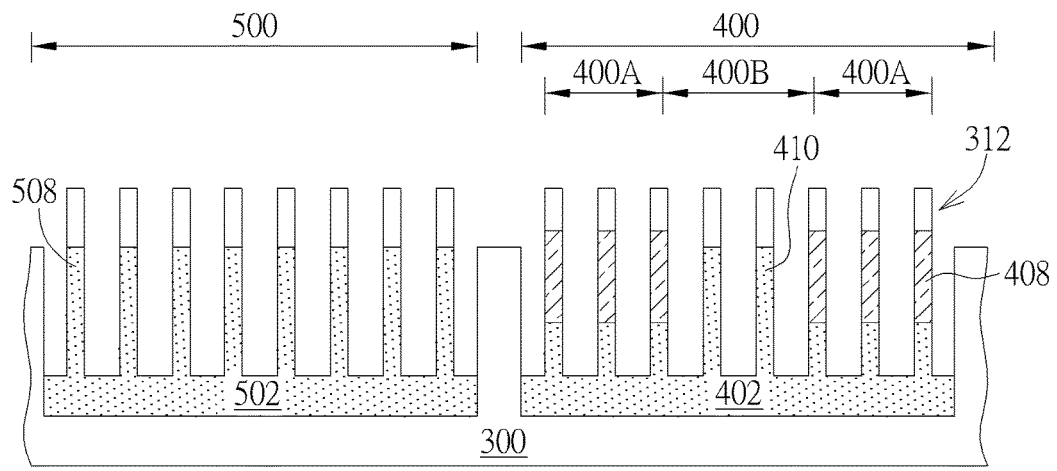
Figure 8:
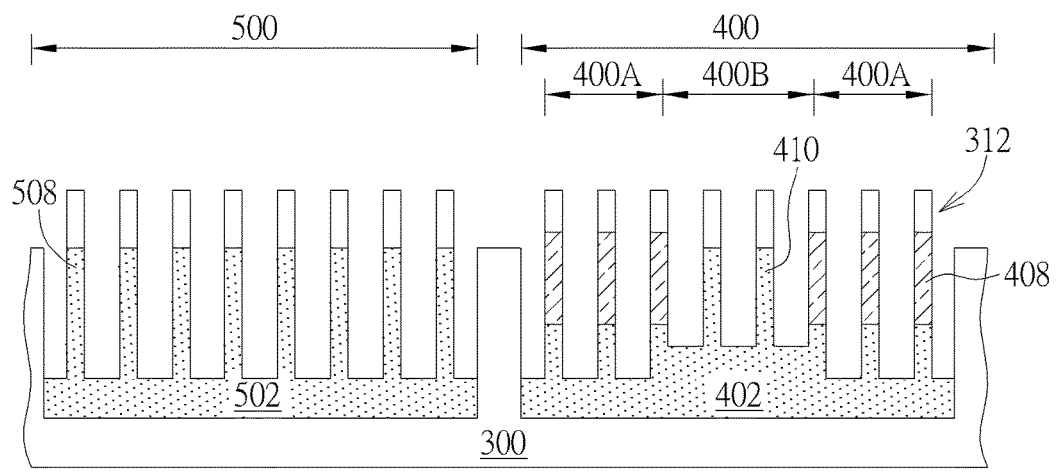

As shown in FIG. 7, after removing the mandrels 314, the stacked structure 312, the semiconductor layer 406 and the substrate 300 are etched sequentially by using the spacers 316 as a mask to a predetermined depth. Therefore, a plurality of first fin structures 408 are formed in the sub regions 400A in the first region 400, a plurality of dummy fin structures 410 are formed in the dummy region 400B in the first region 400, and a plurality of second fin structures 508 are formed in the second region 500. The spacers 316 are removed away. After the etching process, there are stacking structures 312 remained on the first fin structures 408, the dummy fin structures 410 and the second fin structures 508. It is noted that the embodiment shown in FIG. 6 and FIG. 7 is one exemplary embodiment of the sidewall image transfer (SIT) process for forming the fin structures, and one skilled in the arts would understand that the fin structures can also be formed in other ways. For example, they can be formed by directly performing a lithography and patterning process with forming appropriate photo resist layers (not shown) containing patterns corresponding to the fin structures. In another embodiment, as shown in FIG. 8, due to the etching selectivity between material of the first fin structures 408 and that of the dummy fin structures 410, fin heights of the first fin structure 408 may be different from those of the dummy fin structure 410. That is, a top surface of the N type doped well 402 in the dummy region 400B would not be leveled with a top surface of the N type doped well 402 in the sub regions 400A.

Figure 9:
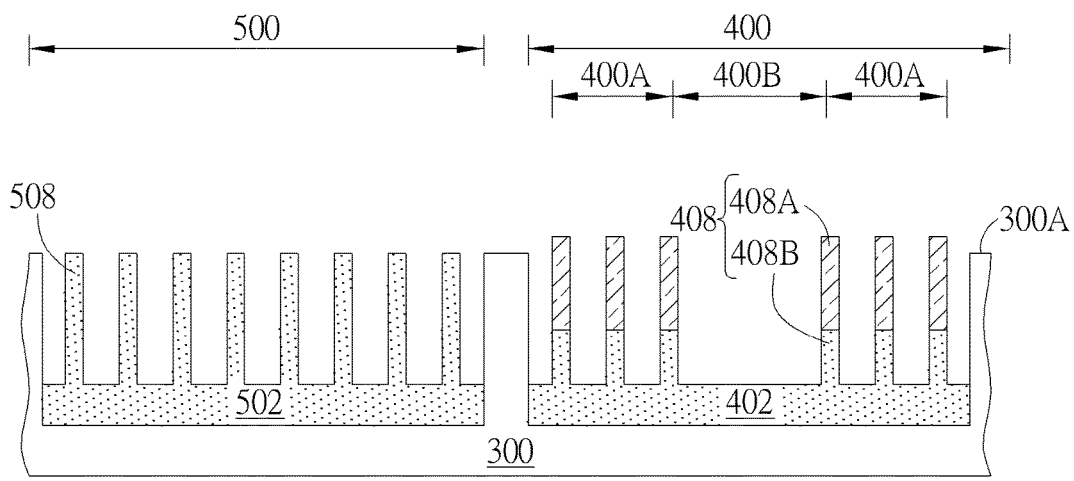

Backing to the embodiment of FIG. 7, next, as shown in FIG. 9, the dummy fin structures 410 in the dummy region 400B are removed away, so that the most bottom surface in the dummy region 400B would be leveled with the most bottom surface in the sub regions 400A. In another embodiment, when the structures as shown in FIG. 8 is subjected to the process for removing the dummy fin structures 410, the most bottom surface of the N type doped well 402 in the dummy region 400B would not still be leveled with the most bottom surface in the sub regions 400A. In another embodiment of the invention, the dummy fin structure 410 are not removed or only top portions of the dummy fin structures 410 are removed, leaving plural mandrels (not shown) made of the N type doped well 402 remained in the dummy region 400B. In addition, the stacking structure 312 on the first fin structures 408 and the second fin structures 508 are completely removed, so as to expose the top surfaces of the first fin structures 408 and the second fin structures 508. In one embodiment as shown in FIG. 9, the remained first fin structure 408 includes a first portion 408A and a second portion 408B, wherein the first portion 408A is formed from the semiconductor layer 408 and the second portion 408B is formed from the doped well 402 of the substrate 300. The first fin structures 408 protrude over the top surface 300A of the substrate 300, and the top surfaces of the second fin structures 508 are leveled with the top surface 300A of the substrate 300. In another embodiment, the stacking structure 312 can be remained on the substrate 300.

By carrying out the above steps, the semiconductor fin structures of the present invention can be provided. In one embodiment, the formed structure can be subjected to other semiconductor processes. Please refer to FIG. 10, which shows a schematic diagram of the method including forming a transistor. After forming the fin structures shown in FIG. 9, a first isolation structure 412 may be formed between the first fin structures 408, and a first gate dielectric layer 414 and a first gate 416 are formed on the first fin structure 408, following by forming appropriate dopants in the first fin structures 408 at two sides of the first gate 416, thereby completing a P-type transistor in the first region 400. Similarly, a second isolation structure 512 may be formed between the second fin structures 508, and a second gate dielectric layer 514 and a second gate 516 are formed on the second fin structures 508, following by forming appropriate dopants in the second fin structure 508 at two sides of the second gate 516, thereby completing an N-type transistor in the second region 500. In another embodiment, other semiconductor manufacturing processes, such as a metal replacement gate process, can further be performed.

It is noted that, the previous embodiment (FIG. 9 to FIG. 10) shows that the first isolation structure 412 and/or the second isolation structure 512 is formed after removing the dummy fin structure 410, however, in another embodiment, the first isolation structure 412 and/or the second isolation structure 512 can be formed before removing the dummy fin structure 410, following by forming the first gate dielectric layer 414, the first gate 416 and the second gate dielectric layer 514, the second gate 516. Please refer to FIG. 11 to FIG. 13, which show schematic diagrams of the method of forming a semiconductor fin structure according to another embodiment of the present invention. The following context will take the embodiment in FIG. 8 as an example, which has higher top surface in the dummy region 400B, but one skilled in the art should be realized that the embodiment in FIG. 7 with leveled top surface can be also in combination to the instant embodiment. After forming the dummy fin structures 410 in FIG. 8, as shown in FIG. 11, a first isolation structure 412 is formed on the N doped well 402 in the first region 412 and a second isolation structure 512 is formed on the P doped well 502 in the second region 500.

Figure 12:
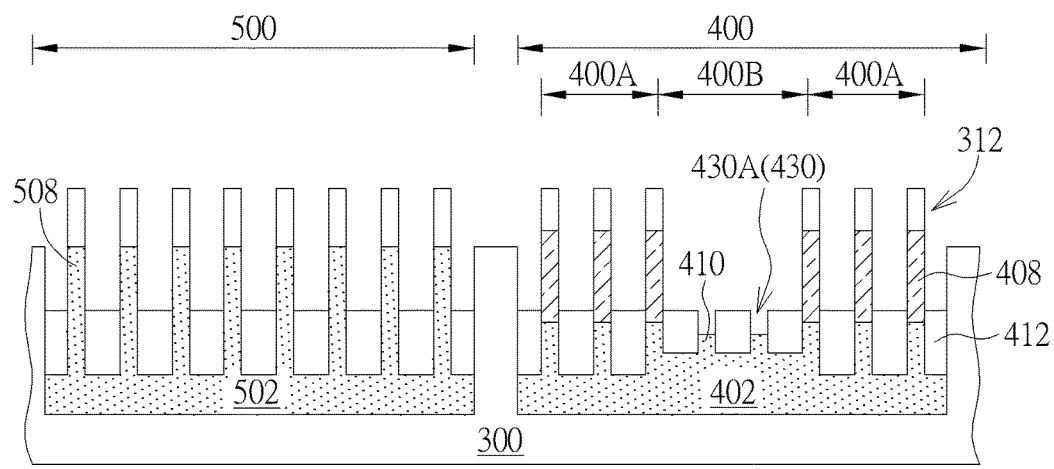
Figure 13:
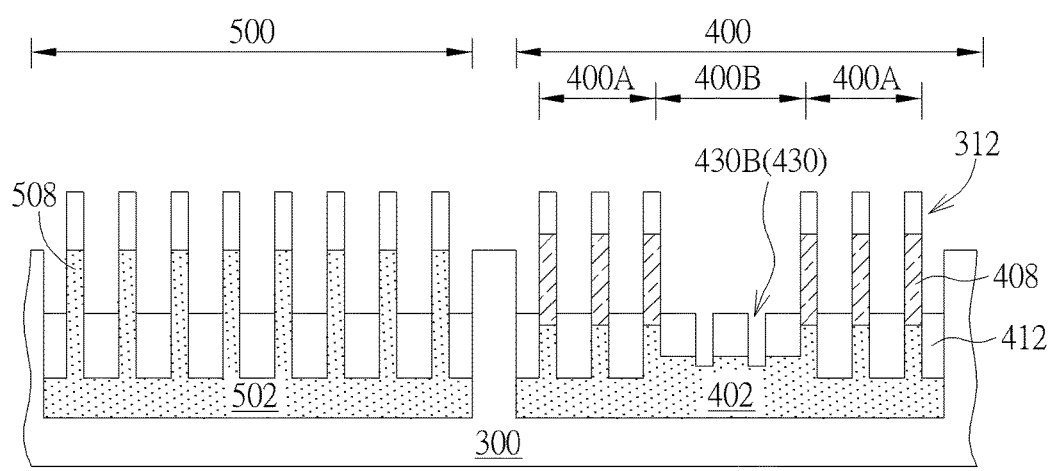

Next, as shown in FIG. 12 or FIG. 13, the dummy fin structures 410 are removed. Depending on different requirements, different depths of recesses 430 corresponding to original dummy fin structures are formed in the first isolation structure 412. As shown in FIG. 12, the recess 430A is formed in the first isolation structure 412 and the top surface of the remained dummy fin structures 410 (or the bottom surface of the recesses 430A) is located at the first isolation structure 412. In another embodiment, as shown in FIG. 13, the process completely removes the dummy fin structures 410 and further forms plural deep recess 430B with a bottom surface reaching to the N type doped well 402, which can be higher, leveled, or even lower than the top surface of the N type doped well in the sub regions 400A. In this embodiment, the top surface of the recess 430 is not covered by the first isolation structure 414.

Figure 10:
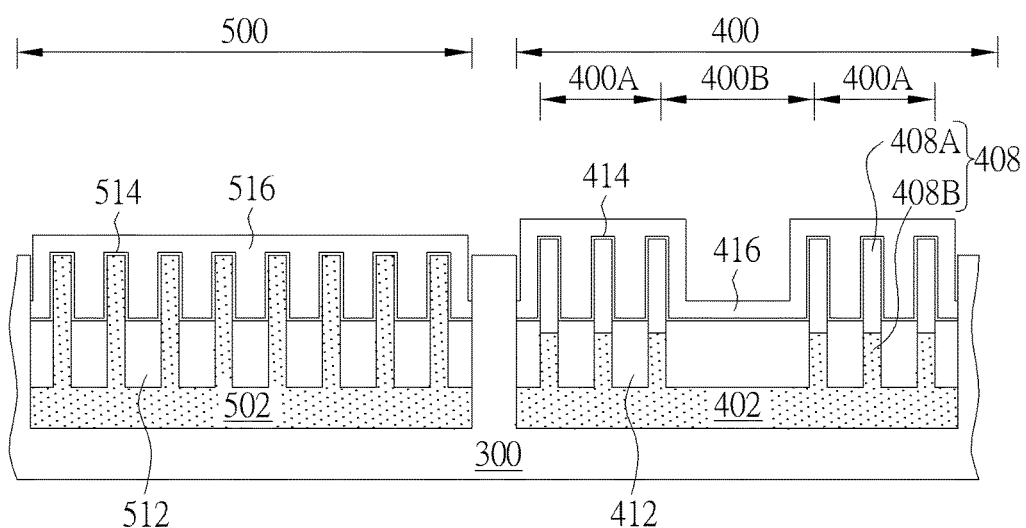
FIG. 10 shows a schematic diagram of the method including forming a transistor.
Figure 11:
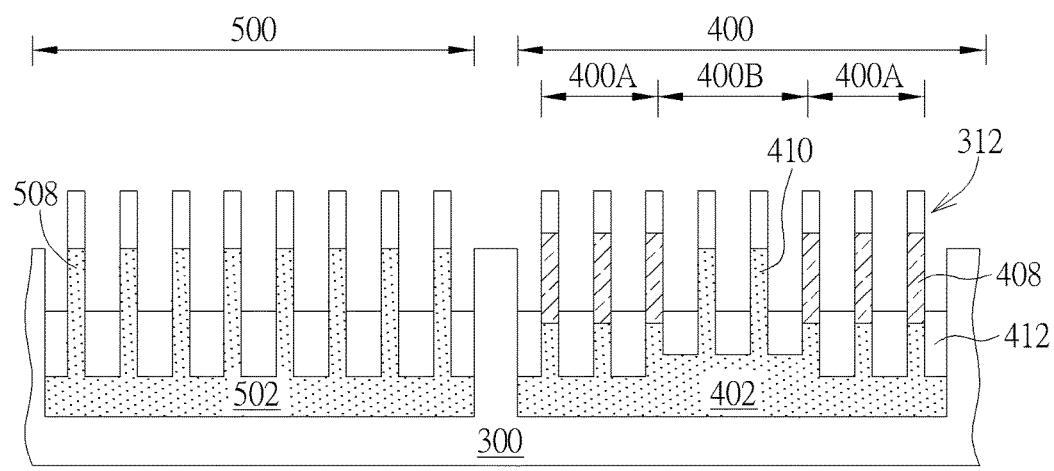
FIG. 11 to FIG. 13 show schematic diagrams of the method of forming a semiconductor fin structure according to another embodiment of the present invention.

Taking back to the embodiment in FIG. 10, the present invention is characterized in that, in the same conductivity type wells (for example, the N-type doped well 402), the semiconductor layer 406 is formed in a smaller area so as to avoid concave top surface of the semiconductor layer 406 (dishing phenomenon). The above embodiment shows simultaneously forming a semiconductor layer 406 in plural trenches 404. In another embodiment of the present invention, a plurality of trenches with the same or different sizes can be formed in the same well of a conductivity type (e.g. N-type doped well 402) and different semiconductor material layers can be formed in succession in each trench.

Further, the above embodiment shows that the semiconductor layer 406 is formed in the first region 400 and there is no semiconductor layer formed in the second region 500. In another embodiment of the present invention, there can be semiconductor layer formed in the second region 406. For example, in FIG. 2, all or a part of the pad layer 302 can be exposed by the patterned mask layer 304, and a semiconductor layer can be formed corresponding in the trench formed by using the patterned mask layer as a mask, leaving the second fin structures 508 have different semiconductor materials. In yet another embodiment of the present invention, the second region 500 may be used to form a generally planar transistor.

In summary, the method of forming fin structures is characterized by defining plural small subregions in one first region, thus, the semiconductor layer will be formed respectively in the sub regions and the dishing problem in conventional arts can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor fin structure, comprising:
    providing a substrate, which has at least two sub regions and a dummy region disposed within a first region, wherein the dummy region is disposed between the two sub regions;
    forming a doped well in the first region;
    forming a recess in each of the two sub regions;
    forming a semiconductor layer to fill into the recesses;
    forming a patterned mask layer on the semiconductor layer in the sub regions and on the substrate in the dummy region; and
    removing a part of the substrate and a part of the semiconductor layer by using the patterned mask layer as a mask, thereby forming a plurality of fin structures in the sub regions and a plurality of dummy fin structures in the dummy region, wherein a top surface of the doped well between each two dummy fin structures in the dummy region is higher than a top surface of the doped well between each two first fin structures in the sub regions.

2. The method of forming a semiconductor fin structure according to claim 1, wherein a depth of the doped well is greater than a depth of the recess.

3. The method of forming a semiconductor fin structure according to claim 1, before forming the recess in each of the two sub regions, further comprising forming a pad layer on a top surface of the substrate.

4. The method of forming a semiconductor fin structure according to claim 3, after forming the semiconductor layer, further comprising performing a planarization process.

5. The method of forming a semiconductor fin structure according to claim 4, after the planarization process, a top surface of the semiconductor layer is leveled with a top surface of the pad layer.

6. The method of forming a semiconductor fin structure according to claim 1, wherein a top surface of each fin structure is higher than a top surface of each dummy fin structure.

7. The method of forming a semiconductor fin structure according to claim 1, wherein a top surface of each fin structure is higher than a top surface of the substrate.

8. The method of forming a semiconductor fin structure according to claim 1, further comprising removing the dummy fin structures.

9. The method of forming a semiconductor fin structure according to claim 1, wherein the substrate further comprises a second region and before forming the recesses, further comprising forming a second doped well in the second region and a conductive type of the doped well is different from a conductive of the second doped well.

10. The method of forming a semiconductor fin structure according to claim 9, wherein the patterned mask layer is disposed on the substrate in the second region.

11. The method of forming a semiconductor fin structure according to claim 9, wherein when forming the fin structures and the dummy fin structures, a plurality of second fin structures are formed simultaneously on the substrate in the second region.

12. The method of forming a semiconductor fin structure according to claim 11, wherein a top surface of the second fin structure is lower than a top surface of the fin structure.

* * * * *